(12) United States Patent
Katou

(10) Patent No.: US 7,602,058 B2
(45) Date of Patent: Oct. 13, 2009

(54) FLIP-CHIP SEMICONDUCTOR DEVICE WITH IMPROVED POWER PAD ARRANGEMENT

(75) Inventor: Toshikazu Katou, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 475 days.

(21) Appl. No.: 11/333,311

(22) Filed: Jan. 18, 2006

(65) Prior Publication Data
US 2006/0157868 A1 Jul. 20, 2006

(30) Foreign Application Priority Data
Jan. 19, 2005 (JP) .............................. 2005-012141

(51) Int. Cl.
*H01L 23/52* (2006.01)
(52) U.S. Cl. .................. 257/691; 257/773; 257/776; 257/778; 257/E23.079; 257/E23.153
(58) Field of Classification Search ................ 257/690, 257/691, 733–786; 438/108
See application file for complete search history.

(56) References Cited

U.S. PATENT DOCUMENTS
6,653,726 B1 * 11/2003 Schultz et al. .............. 257/691

FOREIGN PATENT DOCUMENTS

| JP | 2000-277656 | | 10/2000 |
|----|-------------|---|---------|
| JP | 2002-190526 | | 7/2002 |
| JP | 2003-68852 | | 3/2003 |
| JP | 2003-124318 | | 4/2003 |
| KR | 2002-008404 | * | 5/2001 |

* cited by examiner

*Primary Examiner*—Jasmine J Clark
(74) *Attorney, Agent, or Firm*—McGinn IP Law Group, PLLC

(57) ABSTRACT

A semiconductor device is composed of a power supply interconnection extending from a certain starting point in a first direction and also extending from the starting point in a second direction orthogonal to the first direction, a plurality of power pads, and connecting interconnections providing electrical connection between the power supply interconnection and the power pads. The power supply interconnection, the power pads, and the connecting interconnections are arranged in a symmetrical manner with respect to a symmetry line crossing the starting point and extending in a direction at an angle of 45 degree to the first and second directions.

15 Claims, 6 Drawing Sheets

FLIP-CHIP SEMICONDUCTOR DEVICE WITH IMPROVED POWER PAD ARRANGEMENT

BACKGROUND OF THE INVENTION

1. Field of the Invention

The present invention relates to flip-chip semiconductor devices, particularly to power/ground pad arrangement of flip-chip semiconductor devices.

2. Description of the Related Art

With the improvement of the fine processing technology, semiconductor devices which have been conventionally integrated within plural separate chips can be integrated within a single semiconductor chip.

This is, however, accompanied by the increase in a total number of signal terminals of the single semiconductor chip. The increase in the number of signal pads may cause a problem, because conventional quad flat packaging (QFP) and pin grid array packaging (PGA) may not provide a required number of signal terminals. Accordingly, the flip-chip packaging technique has been increasingly used, instead of the QFP and PGA techniques.

Flip chip packages have various advantages. Firstly, total numbers of signal terminals can be increased. Additionally, power pads can be arranged at arbitrary places of internal areas of semiconductor chips, by using a build-up board within which a power supply plane is integrated. This effectively improves power supply capability within the semiconductor chip.

The flip-chip packaging allows VDD/GND pads to be arranged over the internal area within which internal circuits are integrated as disclosed in Japanese Laid Open Patent Applications Nos. Jp-2003 68852A, and Jp-2003 124318A. In such a flip-chip semiconductor device, the peripheral portion of the internal area experiences potential drop of power supply lines, most severely.

FIG. 1 illustrates an exemplary arrangement of pads and power supply circuitry within a conventional flip-chip. It should be noted that FIG. 1 partially illustrates the structure of the conventional flip-chip semiconductor device; FIG. 1 only illustrates a one-fourth portion at the lower left of the entire flip-chip semiconductor device. The lower right, upper left and upper right portions of the semiconductor device are correspondingly configured in the right-to-left symmetry and in the top-to-bottom symmetry. These portions are not shown in FIG. 1.

The flip-chip semiconductor device is provided with power pads 3 arranged in rows and columns over an internal area within which logic circuits are integrated. It should be noted that the term "power pad" collectively denotes both of the VDD pad fed with a power supply level, and the GND pad fed with an earth ground level. In FIG. 1, the power pads 3 fed with the power supply level are denoted by symbols "V", and the power pads 3 fed with the earth ground level are denoted by symbols "G". The internal area is surrounded by an I/O buffer region 6 within which I/O buffers are integrated. The symbols "S" within the I/O buffer region 6 denotes signal I/O pads connected with the I/O buffers.

The electric power is distributed through first-level interconnections 1 arranged in the uppermost interconnection level, and second-level interconnections 2 arranged in the second uppermost interconnection level. The first-level interconnections 1 are connected with the pads 3 through branch interconnections. The first-level interconnections 1 are connected with the second-level interconnections 2 through via contacts 4. The first-level interconnections 1 and the second-level interconnections 2 are arranged orthogonally to each other; the first-level interconnections 1 are extended in the horizontal direction, for example, and the second-level interconnections 2 are extended in the vertical direction. Chip peripheral power supply loops 5 are arranged at the peripheral portion of the internal area. Horizontally-extending portions of the chip peripheral power supply loops 5 are disposed at the uppermost interconnection level, and vertically-extending portions of the chip peripheral power supply loops 5 are disposed at the second uppermost interconnection level.

For example, electric power is delivered from a VDD pad denoted by a symbol "P1" to a position "c" at the left end of the internal area, through a first-level interconnection 1 between the pad "P1" and a via contact 4 disposed at a position "b", and a chip peripheral power supply loops 5 between the positions "b" and "c". The chip peripheral power supply loop 5 is integrated at the second uppermost interconnection level between the positions "b" and "c".

Correspondingly, electric power is delivered from a VDD pad denoted by a symbol "P2" to a position "g" at the lower end of the internal area, through a first-level interconnection 1 between the pad "P2" and a via contact 4 disposed at a position "e", a second-level interconnection 2 between the via contacts 4 disposed at the positions "e" and "f", and a chip peripheral power supply loop 5 between the positions "f" and "g".

In the conventional flip-chip semiconductor device shown in FIG. 1, the first-level interconnections 1 are extended in the horizontal direction except for the branch interconnections connected with the pads 3, and the second-level interconnections 2 are extended in the vertical direction. Such structure undesirably suffers from increased difference in the interconnection resistance caused by the difference in the interconnection structure difference depending on the positions over the semiconductor chip. For example, the interconnection resistance between the pad "P2" near the lower end of the chip and the position "g" is largely different from that between the pad "P1" near the left end of the chip and the position "c".

A specific calculation result of the interconnection resistances is described in the following, depicting the difference in the interconnection resistances. The calculation is performed under the conditions as follows:

width of the first-level interconnections 1: 1.6 $\mu$m,
sheet resistance thereof: 0.0175 $\Omega/\square$,
width of the second-level interconnection 2: 1.6 $\mu$m,
sheet resistance thereof: 0.0175 $\Omega/\square$,
size of the pads 3: 120×120 $\mu m^2$
pitch of the pads 3 (center-to-center): 250 $\mu$m,
width of the chip peripheral power supply loops 5: 10 $\mu$m,
resistance of the via contacts 4: 0.06 $\Omega$/piece,
distance between the center point of pad P1 and the position "a": 70 $\mu$m,
distance between the center point of the pad P2 and the position "d": 70 $\mu$m,
distance between the positions "a" and "b": 180 $\mu$m,
distance between the positions "d" and "e": 125 $\mu$m,
distance between the positions "b" and "c": 320 $\mu$m,
distance between the positions "e" and "f": 250 $\mu$m, and
distance between the positions "f" and "g": 125 $\mu$m It should be noted that a certain first-level interconnection 1 is assumed to be connected with a certain second-level interconnection 2 through a single via contact 4 within the internal area in this calculation, while the first-level and second level interconnections 1 and 2 are assumed to be connected with the chip peripheral power supply loops 5 through six via contacts 4.

When interconnection resistances are given under the above-explained conditions as follows:

(1) Resistance Value Between Pad P1 and Position "b"

$0.0175\ \Omega/\square \times (70/120) + 0.0175\ \Omega/\square \times (180/1.6) + 0.06/6 = 1.989\Omega;$ (2) Resistance Value Between Pad P1 and Position "c"

Resistance value $(1) + 0.0175\ \Omega/\square \times (320/10) = 2.549\Omega$ (3) Resistance Value Between Pad P2 and Position "f"

$0.0175\ \Omega/\square \times (70/120) + 0.0175\ \Omega/\square \times (125/1.6) + 0.06 + 0.0175\ \Omega/\square \times (250/1.6) = 4.172\Omega;$ and (4) Resistance Value Between Pad P2 and Position "g"

Resistance value $(3) + 0.06/6 + 0.0175\ \Omega/\square \times (125/10) = 4.401\Omega.$ As a consequence, a resistance difference "$\Delta R$" from the associated pads (the pads P1 and P2) of the positions "c" and "g" is given as follows:

$\Delta R = 4.401\Omega - 2.549\Omega = 1.852\Omega.$

This implies that the resistance between the pad P2 the position "g" is increased by +73% with respect to the resistance between the pad P1 and the position "c".

As thus described, the power interconnection resistances between the pads 3 and the positions near the right/left edges of the internal area are relatively lower than those between the pads 3 and the positions near the top/bottom edges of the internal area. This may cause a problem that potential drops along the power supply interconnections are largely different between portions near the top/bottom edges and portions near the right/left edges. More specifically, a potential drop of a power supply voltage must be suppressed to approximately 10 mV in a high-end semiconductor device, in order to reduce the delay of flipflops integrated within the device down to 10 ps or less, which is 10% of required setup time of the flipflops (approximately 100 ps). For example, in such a case that an average consumed current of a high-driven buffer is assumed to be nearly 3.08 mA for each clock cycle, and the high-driven buffer is arranged at the above-described point "g", the high-driven buffer experiences a power supply potential drop of 13.56 mV (3.08 mA×4.401Ω), which largely exceeds 10 mV. This is undesirable for satisfying operation requirements of the semiconductor device.

As previously explained, conventional flip-chip semiconductor devises requires a special circuit arrangement for dealing with delay difference caused by different potential drops between upper/lower edge portions and right/left edge portions, especially when high-drive buffers are arranged in the upper/lower edge portions and the right/left edge portions.

Japanese Laid-Open Patent Application No. Jp-2000 277656A discloses a multi-level printed circuit board having interconnections arranged in a symmetrical manner; however, this document does not disclose pad and interconnection arrangement of a flip-chip semiconductor device.

Additionally, Japanese Laid-Open Patent Application No. Jp-2002 190526A discloses a flip-chip semiconductor device in which I/O cells are arranged in the peripheral portion of the device. In this flip-chip semiconductor device, power pads used for supplying electrical power to the I/O cells are positioned medial to the region in which signal pads of the I/O cells.

SUMMARY OF THE INVENTION

In an aspect of the present invention, a semiconductor device is composed of: a power supply interconnection extending from a certain starting point in a first direction and also extending from the starting point in a second direction orthogonal to the first direction; a plurality of power pads; and connecting interconnections providing electrical connection between the power supply interconnection and the power pads. The power supply interconnection, the power pads, and the connecting interconnections are arranged in a symmetrical manner with respect to a symmetry line crossing the starting point and extending in a direction at an angle of 45 degree to the first and second directions.

Such arrangement causes interconnection resistances from pads to the power supply interconnection to be symmetrical, and thereby allows distribution of the potential drop to be symmetrical with respect to the symmetry line. This effectively reduces the circuit delay difference caused by different potential drops.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
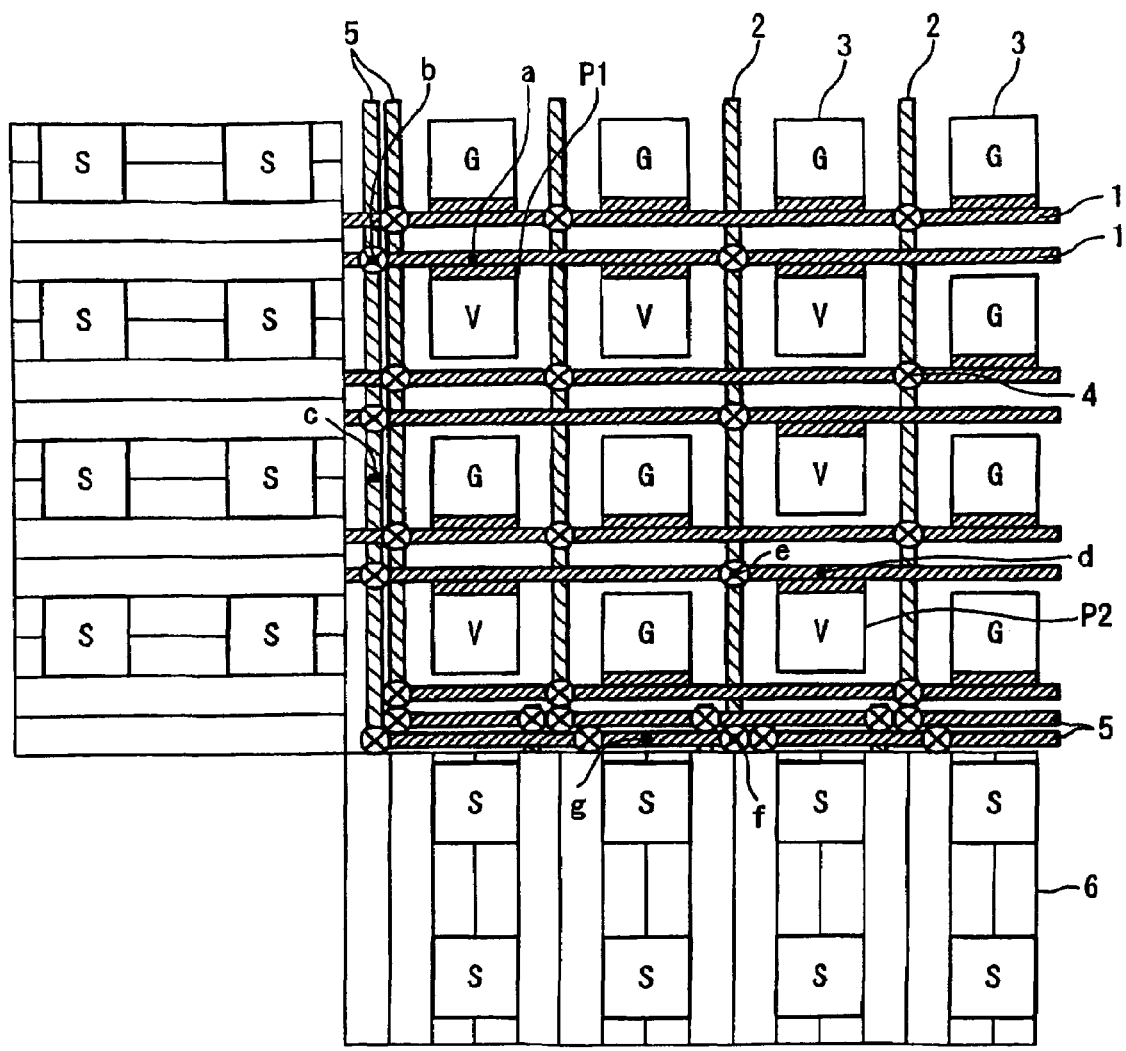
FIG. 1 illustrates a conventional pad arrangement of a flip-chip semiconductor device.
Figure 2:
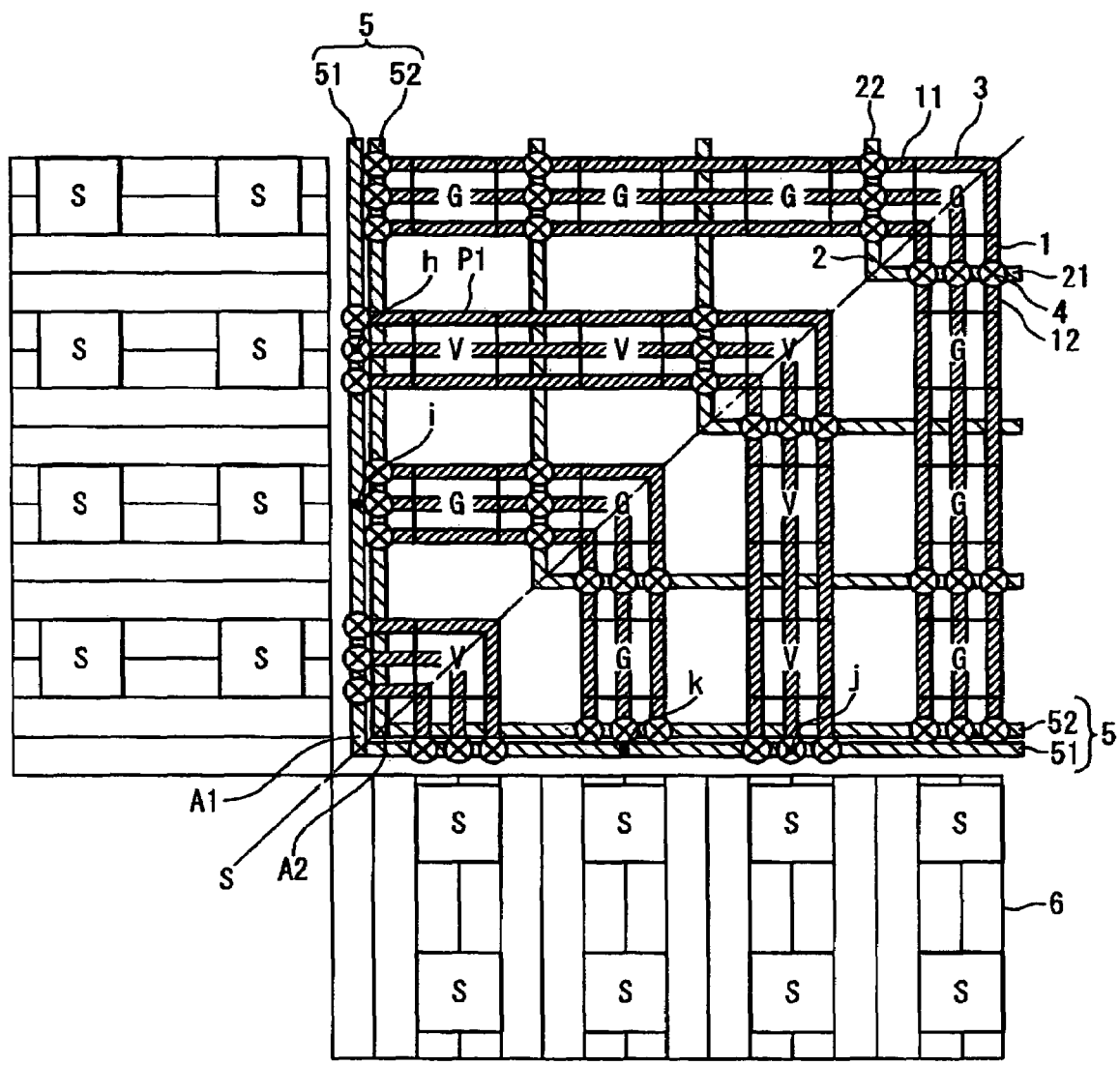
FIG. 2 illustrates an exemplary pad arrangement of a flip-chip semiconductor device in a first embodiment of the present invention.

FIG. 2 illustrates an arrangement of power pads and interconnections within a flip-chip semiconductor device in a first embodiment. It should be noted that FIG. 2 partially illustrates the structure of the flip-chip semiconductor device in this embodiment; FIG. 2 only illustrates a one-fourth portion at the lower left of the entire flip-chip semiconductor device. The lower right, upper left and upper right portions of the semiconductor device are correspondingly configured in the right-to-left symmetry and in the top-to-bottom symmetry. These portions are not shown in FIG. 1.

The flip-chip semiconductor device in this embodiment is composed of first-level interconnections 1, second-level interconnections 2, power pads 3, via contacts 4, and chip peripheral power supply loops 5 within the internal area surrounded by an I/O region The first-level interconnections 1 are integrated within the uppermost interconnection level of the semiconductor device. In the following, horizontally-extending portions of the first-level interconnections 1 may be referred to as first-level horizontal interconnections 11, and vertical-extending portions thereof may be referred to as first-level vertical interconnections 12.

The second-level interconnections 2 are integrated within the second uppermost interconnection level of the semiconductor device. In the following, horizontally-extending portions of the first-level interconnections 2 may be referred to as second-level horizontal interconnections 21, and vertically-extending portions thereof may be referred to as second-level vertical interconnections 22. Each second-level interconnection 2 is looped to uniformly distribute the electric power. It should be noted that the second-level interconnections 2 may be integrated within the third uppermost interconnection level or below.

Power pads 3 are used for receiving the power supply voltage. The power pads 3 includes VDD pads fed with a power supply level, denoted by symbols "V" in FIG. 2, and GND pads fed with an earth ground level, denoted by symbols "G". The power pads 3 (including the VDD and GND pads) are electrically connected with the chip peripheral power supply loops 5 through the first-level interconnections 1.

The via contacts 4 provides electrical connections between different interconnection levels within the semiconductor device. In this embodiment, the first-level horizontal interconnections 11 are connected with the second-level vertical interconnections 22 through the via contacts 4, while the first-level vertical interconnections 12 are connected with the second-level horizontal interconnections 21 through the via contacts 4.

The chip peripheral power supply loops 5 are disposed at the peripheral portion of the internal area. The chip peripheral power supply loops 5 includes a VDD loop line 51 and a GND loop line 52. The VDD loop line 51 extends in the vertical direction from a position "A1" and also extends in the horizontal direction from the position "A1". Correspondingly, the GND loop line 52 extends in the vertical direction from a position "A2" and also extends in the horizontal direction from the position "A2". The chip peripheral power supply loops 5 are integrated within the second uppermost interconnection level.

Disposed in the I/O region 6 are I/O buffers and I/O signal pads connected to the I/O buffers. The I/O signal pads are denoted by symbols "S" in FIG. 2.

The VDD pads (denoted by the symbols "V") and the GND pads (denoted by the symbols "G") are arranged in a symmetrical manner with respect to a symmetry line S that crosses the positions "A1" and "A2", the symmetry line S being defined in the direction at an angle of 45 degree with respect to the vertical/horizontal directions.

The VDD and GND pads are arranged in an alternative fashion along the symmetry line S. Specifically, one VDD pad is arranged at the corner of the array of the power pads 3, and connected with the VDD loop line 51 through the first-level interconnections 1. The VDD pad at the corner is connected with the vertical portion of the VDD loop line 51 through three first-level horizontal interconnections 11, and also connected with the horizontal portion through three first-level vertical interconnections 12.

Three GND pads are arranged adjacent to the VDD pad at the corner, arrayed in an L-shape. The three GND pads are serially connected between the vertical and horizontal portions of the GND loop line 52 through the first-level interconnections 1.

Correspondingly, five VDD pads are arranged adjacent to the three GND pads, and seven GND pads are arranged adjacent to the five VDD pads. Generally speaking, (2i+1) GND pads are arranged adjacent to (2i−1) VDD pads in a direction toward the corner, and serially connected between the vertical and horizontal portions of the GND loop line 52, and (2i+3) VDD pads are arranged adjacent to the (2i+1) GND pads in the direction toward the corner, and serially connected between the vertical and horizontal portions of the VDD loop line 51.

In this embodiment, three first-level interconnections 1 are grouped into an interconnection set. One power pad 3 is connected with another power pad 3 or one of the chip peripheral power supply loop 5 through an interconnection set of three first-level interconnections 1. Although the first-level interconnections 1 cross the power pads 3 in the arrangement shown in FIG. 1, the power pads 3 may be positioned adjacent to the first-level interconnections 1.

Electrical power is delivered from a power pad 3 denoted by a symbol "P1" to a position "i" near the left edge of the internal area, for example, through a set of first-level interconnections 1 (or a set of first-level horizontal interconnection 11) between the power pad "P1" and the position "h", a via contact 4 disposed at the position "h" between the set of first-level interconnections 1 and the VDD loop line 51, and the vertical portion of the VDD loop line 51 between the positions "h" and "i".

Correspondingly, electrical power is delivered from a power pad 3 denoted by a symbol "P2" to a position "k" near the bottom edge of the internal area through a set of first-level interconnections 1 (or a set of first-level vertical interconnection 12) between the power pad "P2" and the position "j", a via contact 4 disposed at the position "j" between the set of first-level interconnections 1 and the VDD loop line 51, and the vertical portion of the VDD loop line 51 between the positions "j" and "k".

In the arrangement illustrated in FIG. 2, the interconnection structures between the power pad P1 and the position "i" and between the power pad P2 and the position "k" are symmetrical with respect to the symmetry line S, and therefore the interconnection resistances between the power pad P1 and the position "i" and between the power pad P2 and the position "k" are substantially equal to each other. Additionally, the interconnection resistances at the positions "h", "i", "j", and "k" are reduced in this embodiment, compared with the conventional arrangement shown in FIG. 1.

A specific calculation result of the interconnection resistances is described in the following. The calculation is performed under the conditions as follows:

width of the first-level interconnections 1: 1.6 μm,
sheet resistance thereof: 0.0175 Ω/□,
width of the second-level interconnections 2: 1.6 μm,
sheet resistance thereof: 0.0175 Ω/□,
size of the pad 3: 120×120 μm$^2$,
pitch of the pads 3 (center-to-center): 250 μm,
width of the chip peripheral power supply loops 5: 10 μm, and
resistance of via contacts 4: 0.06 Ω/piece.

It should be noted that a certain first-level interconnection 1 is assumed to be connected with a certain second-level interconnection 2 through a single via contact 4 within the internal area in this calculation, while the first-level and second level interconnections 1 and 2 are assumed to be connected with the chip peripheral power supply loops 5 through six via contacts 4.

The above-described values are identical to those of the conditions of the calculation with respect to the arrangement shown in FIG. 1.

In this embodiment, the following distances are assumed to be different from those with respect to the arrangement shown in FIG. 1:

distance between the center of the pad P1 and the position "h": 180 μm, distance between the center of the pad P2 and the position "j": 180 μm, distance between the positions "h" and "i": 250 μm, and distance between the positions "j" and "k": 250 μm.

(1) Resistance Between Pad P1 and Position "h"

0.0175 Ω/□×(60/120)+0.0175 Ω/□×(120/1.6)+0.06/ 6=1.331Ω.

(2) Resistance Between Pad P1 and Position "i"

Resistance value (1)+0.0175 Ω/□×(250/120)=1.368Ω.

(3) Resistance Between Pad P2 and Position "j"

0.0175 Ω/□×(60/120)+0.0175 Ω/□×(120/1.6)+0.06/ 6=1.331Ω.

(4) Resistance Between Pad P2 and Position "k":

Resistance value (3)+0.0175 Ω/□×(125/10)=1.368Ω.

As a consequence, a resistance difference "ΔR" from the respective pads (power pads P1 and P2) to the positions "i" and "k" is given as follows:

ΔR=1.368Ω−1.368Ω=0Ω.

In other words, the interconnection resistance between the power pad P1 and the position "i" is substantially identical to that between the power pad P2 and the position "k".

It should be understood that the above-described conditions are merely an example and the characteristics parameters of the interconnections and via contacts are not limited to those described above.

Such arrangement effectively provides symmetrical potential drops over the semiconductor device. For example, in such a case that an average consumed current of a high-driven buffer is assumed to be nearly 3.08 mA for each clock cycle, and the high-driven buffer is arranged at the above-described point "g", the high-driven buffer experiences a power supply potential drop of 4.21 mV (3.08 mA×1.368Ω), which is largely reduced below 10 mV. This effectively allows operation requirements to be easily satisfied with respect to the circuit delay variations.

Figure 3:
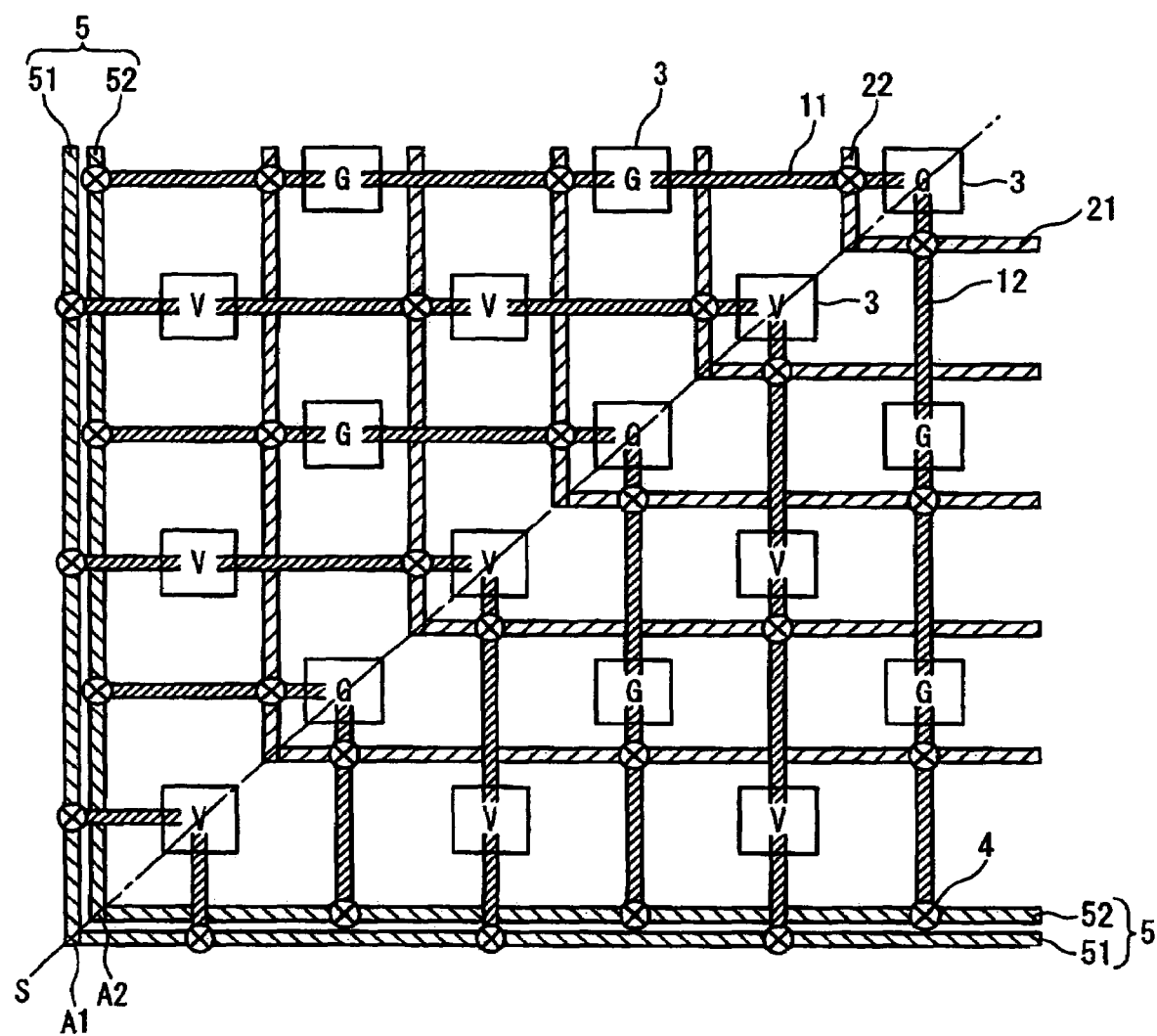
FIG. 3 illustrates an exemplary pad arrangement of a flip-chip semiconductor device in a second embodiment of the present invention.

FIG. 3 illustrates an exemplary arrangement of power pads and interconnections in a second embodiment of the present invention. In the second embodiment, the arrangement of the power pads 3 is modified within the flip-chip semiconductor device. The power pads 3 are arranged in a zigzag fashion in the second embodiment. More specifically, equally spaced columns of the VDD pads (denoted by symbols "V" in FIG. 3) and equally spaced columns of the GND pads (denoted by symbols "V" in FIG. 3) are alternately arranged, and equally spaced rows of the VDD pads and equally spaced rows of the GND pads are alternately arranged. The power pads 3 are arranged so that the columns of the VDD pads are displaced from the columns of the GND pads, and the rows of the VDD pads are displaced from the rows of the GND pads. Such zigzag arrangement is effective for highly integrating the power pads 3 within a small area with increased intervals.

In the arrangement shown in FIG. 3, each power pad 3 is connected with the adjacent power pad 3 or the associated chip peripheral power supply loop 5 through a single first-level interconnection 1, differently from the arrangement shown in FIG. 2. The second-level interconnections 2 are arranged identically to the arrangement shown in FIG. 2. It should be noted that the FIG. 3 illustrates a one-fourth portion at the lower left of the semiconductor device. It should be also understood that an I/O region 6 is also provided around the internal area in this embodiment although not shown in FIG. 3.

It would be apparent that the arrangement shown in FIG. 3, in which the power pads 3, the first-level interconnections 1, and the second-level interconnections 2 are arranged in a symmetrical manner, provides the same advantages as that shown in FIG. 2.

Figure 4:
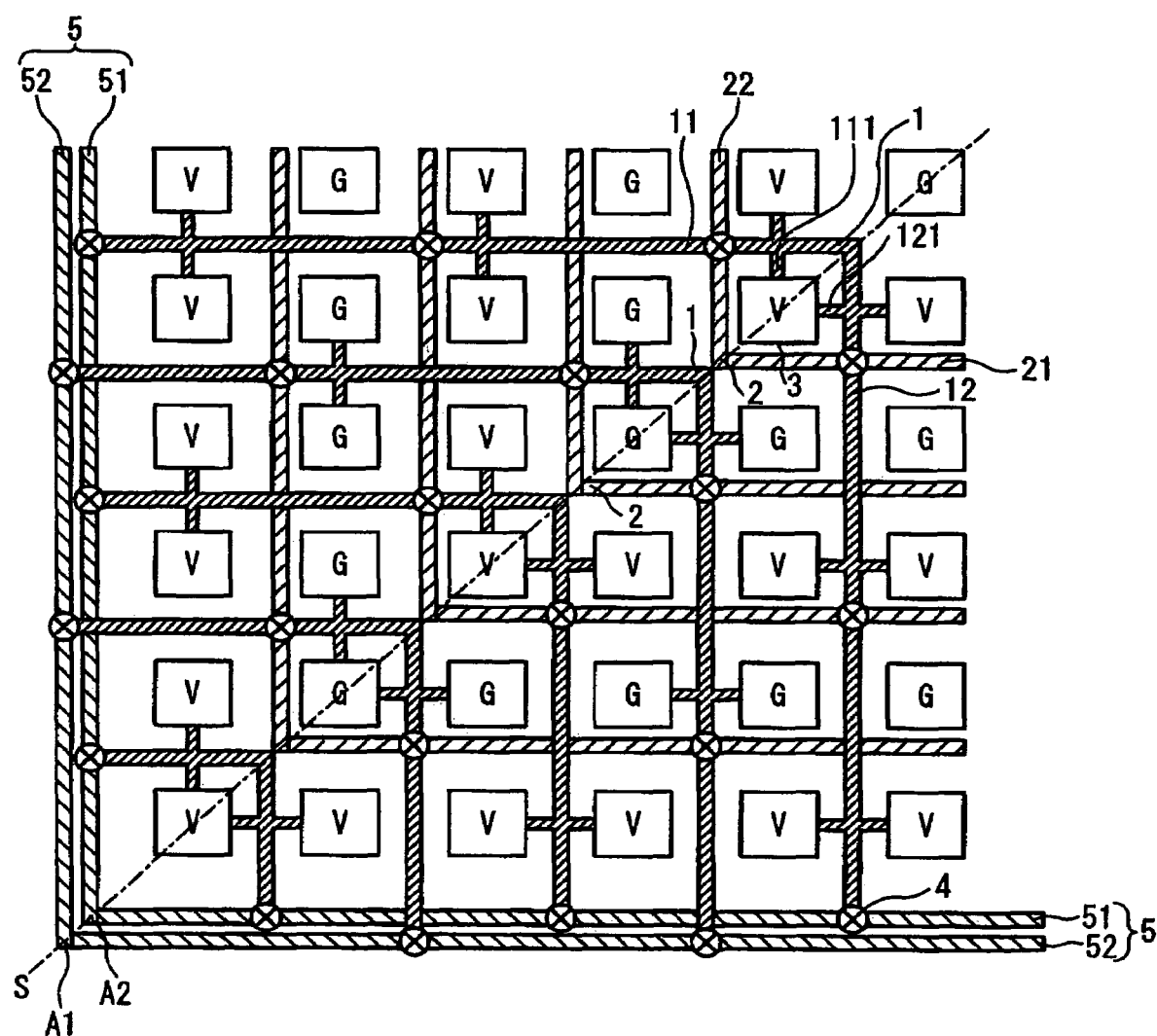
FIG. 4 illustrates an exemplary pad arrangement of a flip-chip semiconductor device in a third embodiment of the present invention.

FIG. 4 illustrates an exemplary arrangement of a flip-chip semiconductor device in a third embodiment. In the arrangement shown in FIG. 4, the first-level interconnections 1 are arranged not to cross the power pads 3. It should be noted that the FIG. 4 only illustrates the lower left portion of the semiconductor device. It should be also understood that an I/O region 6 is also provided around the internal area in this embodiment although not shown in FIG. 4.

In the third embodiment, the first-level interconnections 1 are arranged passing between adjacent power pads 3. The power pads 3 are connected with the first-level interconnections 1 through branch interconnections. The branch interconnections branching from the first-level horizontal interconnections 11 are referred to as the branch interconnections 111, and the branch interconnections branching from the first-level vertical interconnections 12 are referred to as the branch interconnections 121. In this embodiment, the branching interconnections 111 are orthogonal to the first-level horizontal interconnections 11, and the branching interconnections 121 are orthogonal to the first-level vertical interconnections 12. The branching interconnections 111 and 121 are integrated within the first interconnection level, identically to the first-level interconnections 1. The first-level interconnections 1 connected with the VDD pads are connected with the VDD loop line 51, The second-level interconnections 2 are arranged identically to the arrangement shown in FIG. 2.

Adjacent two VDD pads are connected with each other through branching interconnections 111 (or 121), and adjacent two GND pads are connected with each other through branching interconnections 111 (or 121). The adjacent two VDD pads and the branching interconnections 111 (or 121) therebetween are arranged in a symmetrical manner with respect to the associated first-level horizontal interconnection 11 (or the associated first-level vertical interconnection 12).

It would be apparent that the arrangement shown in FIG. 4, in which the power pads 3, the first-level interconnections 1, the second-level interconnections 2, and the branch interconnections 111 and 121 are arranged in a symmetrical manner, provides the same advantages as that shown in FIG. 2.

Figure 5:
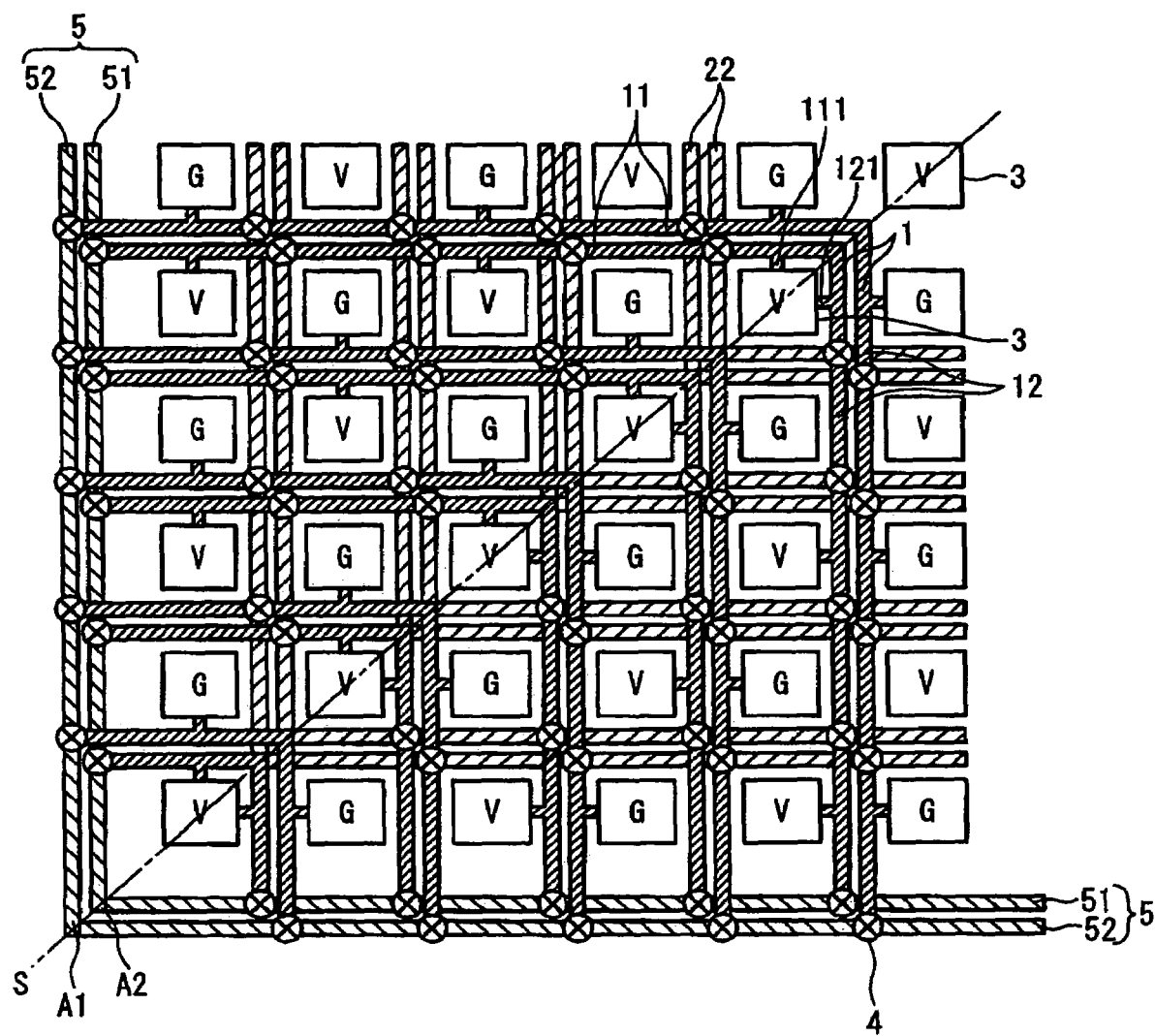
FIG. 5 illustrates an exemplary pad arrangement of a flip-chip semiconductor device in a fourth embodiment of the present invention.

FIG. 5 illustrates an exemplary arrangement of a flip-chip semiconductor device in a fourth embodiment. In the fourth embodiment, the first-level interconnections 1 are arranged passing between adjacent power pads 3, and the VDD pads and GND pads are arranged in a checked pattern; each VDD pad is adjacent to GND pads in both of the vertical and horizontal direction, and each GND pad is adjacent to VDD pads in both of the vertical and horizontal direction. It should be noted that the FIG. 5 only illustrates the lower left portion of the semiconductor device. It should be also understood that an I/O region 6 is also provided around the internal area in this embodiment, although not shown in FIG. 5.

In the fourth embodiment, the first-level interconnections 1 are paired, passing between the power pads 3. One of each paired first-level interconnections 1 is connected to the VDD pads, and the other is connected to the GND pads. In this embodiment, the VDD pads and the GND pads are connected with the associated first-level interconnections 1 through branching interconnections 111, 121.

Figure 6:
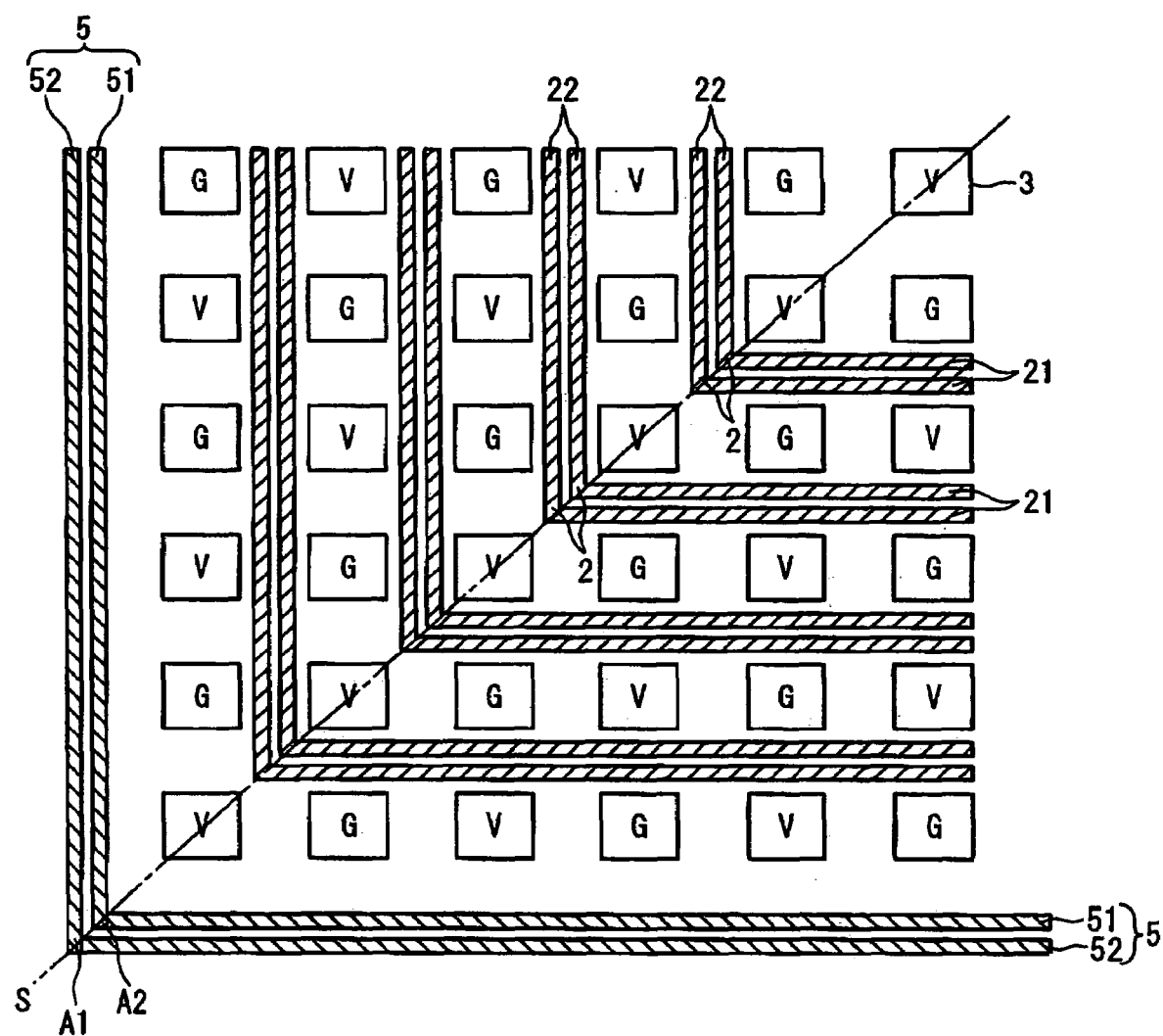
FIG. 6 illustrates the exemplary pad arrangement of the flip-chip semiconductor device with uppermost interconnection level interconnections removed in the fourth embodiment.

As shown in FIG. 6, the second-level interconnections 2 are arranged identically to the arrangement in FIG. 2, except for that the second-level interconnections 2 are paired. Referring back to FIG. 5, one of the paired second-level interconnections 2 is connected with the first-level interconnections 1 connected with the VDD pads, and the other is connected with the first-level interconnections 1 connected with the GND pads.

It would be apparent that the arrangement shown in FIG. 5, in which the power pads 3, the first-level interconnections 1, the second-level interconnections 2, and the branch interconnections 111 and 121 are arranged in a symmetrical manner, provides the same advantages as that shown in FIG. 2.

In summary, the flip-chip semiconductor devices described in the first to fourth embodiments are designed so that the VDD pads (denoted by the symbols "V") and GND pads (denoted by the symbols "G") are arranged in the symmetrical manner with respect to the symmetry line S. Additionally, the first-level and second-level interconnections 1 and 2, used for distributing the power supply voltage, are also arranged in the symmetrical manner with respect to the symmetry line S, orthogonally to one another.

Such arrangement effectively reduces the interconnections resistance at the peripheral portion of the internal area, and also allows the interconnections resistances to be symmetrical with respect to the symmetry line S. This achieves the symmetrical potential drop distribution, which is especially advantageous for an arrangement in which high drive buffers are disposed at the peripheral portion of the internal area, reducing the delay variations.

It is apparent that the present invention is not limited to the above-described embodiments, which may be modified and changed without departing from the scope of the invention.

It should be especially noted that the positions of the VDD pads and the GND pads may be exchanged. It is apparent that the same effect is obtained by the arrangement in which the positions of the VDD and GND pads are exchanged.

What is claimed is:

1. A semiconductor device comprising:
 a power supply interconnection extending from a first position in a first direction and also extending from said first position in a second direction orthogonal to said first direction;
 a plurality of power pads; and
 connecting interconnections which provides electrical connections between said power pads and said power supply interconnection,
 wherein said power supply interconnection, said power pads, and said connecting interconnections are arranged in a symmetrical manner with respect to a symmetry line passing said first position and extending in a direction at an angle of 45 degree to said first and second directions.

2. The semiconductor device according to claim 1, wherein said power supply interconnection includes:
 a first interconnection extending in said first direction; and
 a second interconnection extending in said second direction,
 wherein said first and second interconnections of said power supply interconnection are integrated in the same interconnection level.

3. The semiconductor device according to claim 1, wherein said power supply interconnection includes:
 a first interconnection extending in said first direction; and
 a second interconnection extending in said second direction,
 wherein said connecting interconnections includes:
 a third interconnection connected with said first interconnection at a second position, and extending from said second position in said second direction;
 a fourth interconnection connected with said second interconnection, said second interconnection at a third position, and extending from said third position in said first direction,
 wherein one of said power pads is positioned on said symmetry line, and electrically connected with said first interconnection through said third interconnection, and with said second interconnection through said fourth interconnection,
 wherein a distance between said first and second positions is identical to a distance between said first and third positions, and
 wherein a distance from said one of said power pads to said first interconnection is identical to a distance from said one of said power pads to said second interconnection.

4. The semiconductor device according to claim 3, wherein said third and fourth interconnections are integrated within a first interconnection level, and
 wherein said power supply interconnection is integrated within a second interconnection level under said first interconnection level.

5. The semiconductor device according to claim 3, wherein said first and second interconnections are connected orthogonally to each other at said first position,
 wherein said first and third interconnections are connected orthogonally to each other at said second position, and
 wherein said second and fourth interconnections are connected orthogonally to each other at said third position.

6. The semiconductor device according to claim 3, wherein said first and third interconnections are connected through a first via contact at said second position, and
 wherein said first and third interconnections are connected through a second via contact at said third position.

7. The semiconductor device according to claim 3, wherein said plurality of power pads includes:
 a first intermediate power pad connected between said first interconnection and said one of said plurality of power pads through said third interconnection;
 a second intermediate power pad connected between said second interconnection and said one of said plurality of power pads through said fourth interconnection.

8. The semiconductor device according to claim 3, wherein first one of said plurality of power pads is connected to said third interconnection through a first branching interconnection,
 wherein second one of said plurality of power pads is connected to said third interconnection through a second branching interconnection, said first and second ones of said plurality of power pads being positioned in a symmetric manner with respect to said symmetry line, and
 wherein said first and second branching interconnections are positioned in a symmetric manner with respect to said symmetry line.

9. The semiconductor device according to claim 3, wherein said plurality of power pads includes:

a first symmetrically-arranged power pad connected with said third interconnection through another branching interconnection, said first symmetrically-arranged power pad and said first one of said plurality of power pads being arranged in a symmetrical manner with respect to said third interconnection; and a second symmetrically-arranged power pad connected with said fourth interconnection through still another branching interconnection, said second symmetrically-arranged power pad and said second one of said plurality of power pads being arranged in a symmetrical manner with respect to said fourth interconnection.

10. The semiconductor device according to claim 3, wherein said one of said plurality of power pads positioned on said symmetry line is connected with said third interconnection through a third branching interconnection, and connected with said fourth interconnection through a fourth branching interconnection, and wherein said third and fourth interconnections are arranged in a symmetrical manner with respect to said symmetry line S.

11. The semiconductor device according to claim 10, wherein said plurality of power pads includes:

a third symmetrically-arranged power pad connected with said third interconnection through another branching interconnection, said third symmetrically-arranged power pad and said one of said plurality of power pads being arranged in a symmetrical manner with respect to said third interconnection; and a fourth symmetrically-arranged power pad connected with said fourth interconnection through still another branching interconnection, said fourth symmetrically-arranged power pad and said one of said plurality of power pads being arranged in a symmetrical manner with respect to said fourth interconnection.

12. The semiconductor device according to claim 3, wherein said plurality of power pads includes VDD pads fed with a power supply level, and wherein said third and fourth interconnections are connected with said VDD pads.

13. The semiconductor device according to claim 3, wherein said plurality of power pads includes GND pads fed with an earth ground level, and wherein said third and fourth interconnections are connected with said GND pads.

14. The semiconductor device according to claim 3, further comprising:

a first additional interconnection arranged adjacent to said first interconnection in parallel to said first interconnection; and a second additional interconnection arranged adjacent to said second interconnection in parallel to said second interconnection;

wherein said plurality of power pads includes:

a VDD pad fed with a power supply level; and a GND pad fed with an earth ground level; and wherein said first and second interconnections are electrically connected with said VDD pad, and wherein said first and second additional interconnections are electrically connected with said GND pad.

15. The semiconductor device according to claim 3, further comprising:

a third additional interconnection arranged adjacent to said third interconnection in parallel to said third interconnection; and a fourth additional interconnection arranged adjacent to said fourth interconnection in parallel to said fourth interconnection;

wherein said plurality of power pads includes:

a VDD pad fed with a power supply level; and a GND pad fed with an earth ground level; and wherein said third and fourth interconnections are electrically connected with said VDD pad, and wherein said third and fourth additional interconnections are electrically connected with said GND pad.

* * * * *